United States Patent
Okai et al.

(10) Patent No.: US 7,976,950 B2
(45) Date of Patent: Jul. 12, 2011

(54) TRANSPARENT CONDUCTIVE FILM AND ELECTRONIC DEVICE INCLUDING SAME

(75) Inventors: Makoto Okai, Tokorozawa (JP); Motoyuki Hirooka, Kumagaya (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/791,336

(22) Filed: Jun. 1, 2010

(65) Prior Publication Data

US 2010/0304131 A1 Dec. 2, 2010

(30) Foreign Application Priority Data

Jun. 2, 2009 (JP) ................................. 2009-132656

(51) Int. Cl.
*B32B 9/00* (2006.01)
(52) U.S. Cl. ..................................... 428/408; 423/447.3
(58) Field of Classification Search .................. 428/408; 423/447.1, 445 B
See application file for complete search history.

(56) References Cited

U.S. PATENT DOCUMENTS

2007/0284557 A1* 12/2007 Gruner et al. ................. 252/500

FOREIGN PATENT DOCUMENTS

JP 06-172995 6/1994

* cited by examiner

*Primary Examiner* — David R Sample
*Assistant Examiner* — Daniel Miller
(74) *Attorney, Agent, or Firm* — Antonelli, Terry, Stout & Kraus, LLP.

(57) ABSTRACT

The transparent conductive film according to the present invention comprises graphene platelets which overlap one another to form a multilayer structure. The average size of the graphene platelets is 50 nm or more and the number of layers of the graphene platelets is 9 or less. The transparent conductive film has an electrical resistivity of $1.0 \times 10^{-6}$ ($\Omega$m) or less and a light transmission at a wavelength of 550 nm of 80% or more.

12 Claims, 3 Drawing Sheets

SIZE OF GRAPHENE PLATELET (nm)

TRANSPARENT CONDUCTIVE FILM AND ELECTRONIC DEVICE INCLUDING SAME

CLAIM OF PRIORITY

The present application claims priority from Japanese patent application serial no. 2009-132656 filed on Jun. 2, 2009, the content of which is hereby incorporated by reference into this application.

BACKGROUND OF THE INVENTION

1. Field of the Invention

The present invention relates to transparent conductive films formed of graphene and electronic devices such as flat panel display devices including such transparent conductive films.

2. Description of Related Art

Conventionally, ITO (Indium Tin Oxide) has been widely used as a material for transparent conductive films (see, e.g., JP-A Hei 6 (1994)-172995). ITO is an inorganic compound of tin oxide and indium oxide, typically 5-10 mass % of tin oxide by mass. Since the indium (In) is a rare metal, its availability is easily affected by a market value and there is concern over its future availability. Therefore, it is desirable to develop alternative transparent conductive films.

SUMMARY OF THE INVENTION

In recent years, graphenes (also called graphene sheets) are come into the spotlight as attractive electronic materials. Herein, graphenes are a sheet of six-membered carbon rings which does not form a closed surface, and are formed by connecting numerous benzene rings two-dimensionally. Carbon nanotubes are formed by rolling up a graphene sheet into a tubular structure. Graphites are formed by stacking multiple graphene sheets. Each carbon atom in a graphene sheet has an $sp^2$ hybrid orbital, and delocalized electrons are present at opposite surfaces of a graphene sheet.

The following typical physical properties of graphenes have been reported: (a) The carrier mobility is in the order of 200,000 $cm^2$/Vs, which is one order of magnitude higher than those of silicon (Si) crystals and is also higher than those of metals and carbon nanotubes. (b) The 1/f noises of typical nanodevices can be significantly reduced. (c) The refractive index is negative. (d) The surface electrons behave as if they have no mass. Because of these properties, graphenes are identified as a candidate for post-silicon electronic materials.

Under the above circumstances, it is an objective of the present invention to provide transparent conductive films formed of inexpensive carbon materials, instead of rare metals such as indium.

(I) According to one aspect of the present invention, there is provided a transparent conductive film having a multilayer structure in which graphene platelets overlap one another.

In the above aspect (I) of the invention, the following modifications and changes can be made.

(i) Average size of the graphene platelets is 50 nm or more, and number of layers of the multilayer structure is 9 or less.

(ii) Each of the graphene platelets consists of single atomic layer or a plurality of atomic layers less than 9, and total number of the atomic layers in the multilayer structure is 9 or less.

(iii) The transparent conductive film has an electrical resistivity of $1 \times 10^{-6}$ µm or less and a light transmission at a wavelength of 550 nm of 80% or more.

(II) According to another aspect of the present invention, there is provided a transparent conductive film-on-substrate comprising a substrate and the above-mentioned transparent conductive film formed on the substrate, the substrate made of a glass or a plastic.

In the above aspect (II) of the invention, the following modifications and changes can be made.

(iv) The transparent conductive film is formed on the substrate by a chemical vapor deposition method.

(v) The transparent conductive film is formed by applying at least one material selected from polyvinyl alcohol, polyvinyl chloride, polyvinyl pyrrolidone, polyacrylamide, polyethylene terephthalate, and hydroxypropyl cellulose on the substrate and then by heat-treating the substrate.

(III) According to still another aspect of the present invention, there is provided an electronic device comprising the abovementioned transparent conductive film.

In the above aspect (III) of the invention, the following modifications and changes can be made.

(vi) The electronic device is a flat panel display device, a touch panel, or a photovoltaic cell.

ADVANTAGES OF THE INVENTION

According to the present invention, it is possible to provide transparent conductive films formed of only inexpensive carbon materials, instead of rare metals such as indium, and to provide electronic devices including such transparent conductive films.

DETAILED DESCRIPTION OF THE PREFERRED EMBODIMENTS

First, a basic idea of the present invention will be explained below with reference to FIGS. 1 and 2.

Figure 1:
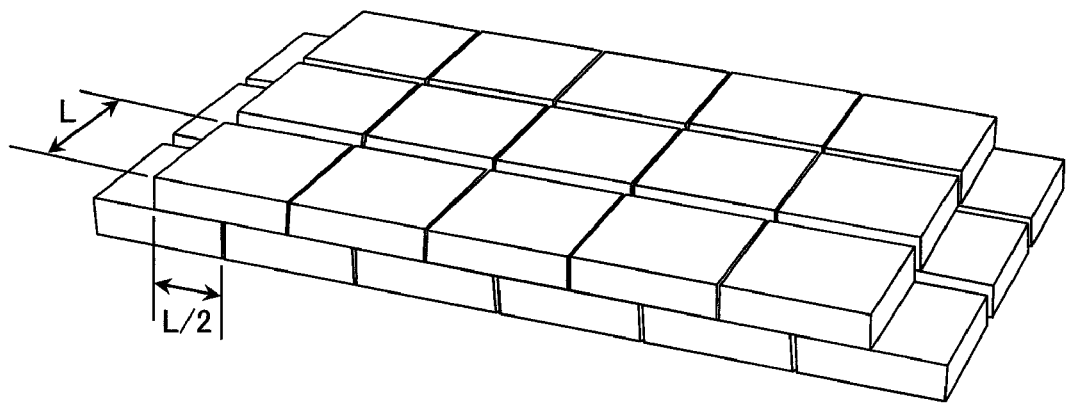
FIG. 1 is an explanatory model illustration showing a perspective view of a transparent conductive film in accordance with the present invention.

FIG. 1 is an explanatory model illustration showing a perspective view of a transparent conductive film in accordance with the present invention in order to calculate the electrical resistivity of the film. Assuming that graphene platelets, each of which measuring L (unit: µm) per side, overlap one another by half its length to form a conducting channel from left to right in the figure. In FIG. 1, the model comprises three such channels formed in parallel. Based on this structure, the electrical resistivity (unit: Ωm) is calculated in the case of forming a 1-μm-square wiring. The contact resistance $R_{gg}$ between L-μm-square graphene platelets is given by the following equation (Eq.) 1.

$$R_{gg} = \frac{r_{cgg}}{L \times \frac{L}{2}} = \frac{2r_{cgg}}{L^2}$$ Eq. 1 where $r_{cgg}$ is the interface resistance between graphite bulks.

Since each 2/L of this $R_{gg}$ are connected in series to form one channel, 1/L of which is in parallel, the electrical resistance of 1-μm-square graphene platelets $R_t$ is given by the following Eq. 2.

$$R_t = R_{gg} \frac{2}{L} L = \frac{4r_{gg}}{L^2}$$ Eq. 2

Furthermore, the electrical resistivity of the wiring is given by multiplying $R_t$ by the cross-sectional area of the wiring and dividing by the length of the wiring. Herein, the electrical resistance of graphene itself can be ignored since it is negligibly smaller than the contact resistance therebetween, and $r_{cgg}$ of 10 Ωμm² is assumed. Also, the thickness of a graphene platelet is assumed as 0.34 nm, which means a graphene platelet comprises a single-atom graphene layer (single graphene sheet).

The equations described above apply to the case of graphene platelets in a 2-layer stack. In the case of graphene platelets in a 9-layer stack, since 8 layers of channels are connected in parallel along the longitudinal direction, $R_t$ is given by dividing Eq. 2 by 8. FIG. 2 is an explanatory graph showing the correlation between the size of graphene platelet and the electrical resistivity in accordance with the present invention, as the calculation results. As shown in FIG. 2, it was revealed that the electrical resistivity of the wiring decreased with increasing the size of graphene platelet.

Meanwhile, the light absorption of a graphene sheet at a wavelength of 550 nm is about 2.3%. Therefore, in the case of graphene platelets in a 2-layer stack (two graphene sheets), the light transmission is about 95.5%, and in the case of graphene platelets in a 9-layer stack (nine graphene sheets), about 81.1%. Since the light transmission of a commercially available ITO (Indium Tin Oxide) film is typically 80% and the electrical resistivity is $1.5 \times 10^{-6}$ (Ωm), graphene platelets that are 50 nm or larger in size can achieve performance comparable to that of ITO. In addition, since the light transmission of a commercially available ITO film is 80%, a wiring film formed of graphene platelets in a 9- or less-layer stack can achieve performance comparable to that of an ITO film.

As described above, 50-nm or larger-square graphene platelets in 9- or less-layer stack can achieve a light transmission of 80% or more, and an electrical resistivity of $1.0 \times 10^{-6}$ (Ωm) or less. Such performances are equal to, or higher than, those of a conventional ITO film. In other words, there can be provided a graphene transparent conductive film (also called transparent electrode) that can replace an ITO film. Moreover, a graphene platelet comprising a plurality of atomic layers is regarded as the same as a single-atom graphene layer, if the total number of atomic layers of graphene platelets in the multilayer structure is 9 or less.

Preferred embodiments of the present invention will be described below. However, the invention is not limited to the specific embodiments described below, but various combinations of its features are possible within the scope of the invention.

First Embodiment of Present Invention

Figure 3:
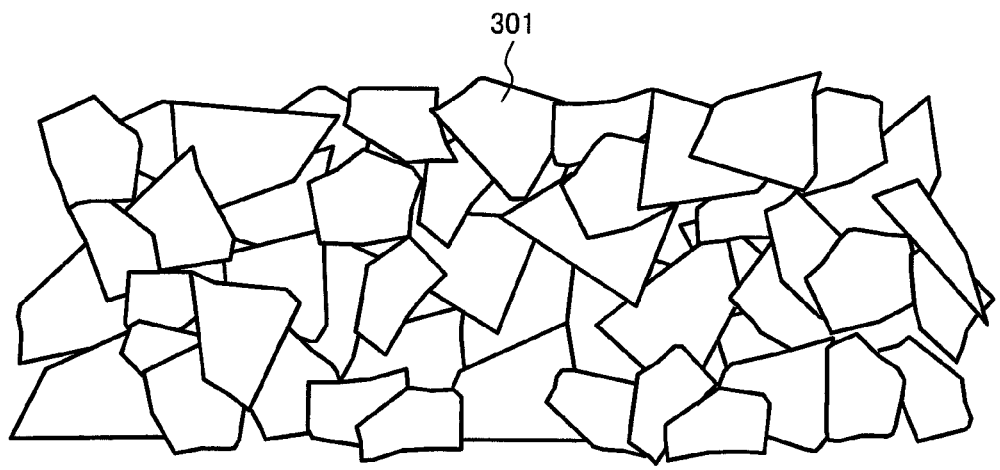
FIG. 3 is a schematic illustration showing a plan view of a transparent conductive film in accordance with a first embodiment of the present invention.

A first embodiment of the present invention will be described with reference to FIG. 3. FIG. 3 is a schematic illustration showing a plan view of a transparent conductive film in accordance with a first embodiment of the present invention. As shown in FIG. 3, graphene platelets 301 overlap one another to form a multilayer structure, from which a transparent film with a low electrical resistivity can be formed. Since actual graphene platelets come in various shapes, the size of graphene platelets is defined as an average of the arithmetic mean between the longest diameter and the shortest one of each platelet. The average size of graphene platelets can be measured either by observing a thin film of graphene separated from a substrate under a transmission electron microscope, or by observing a thin film of graphene formed on a substrate under a scanning tunneling microscope.

Figure 2:
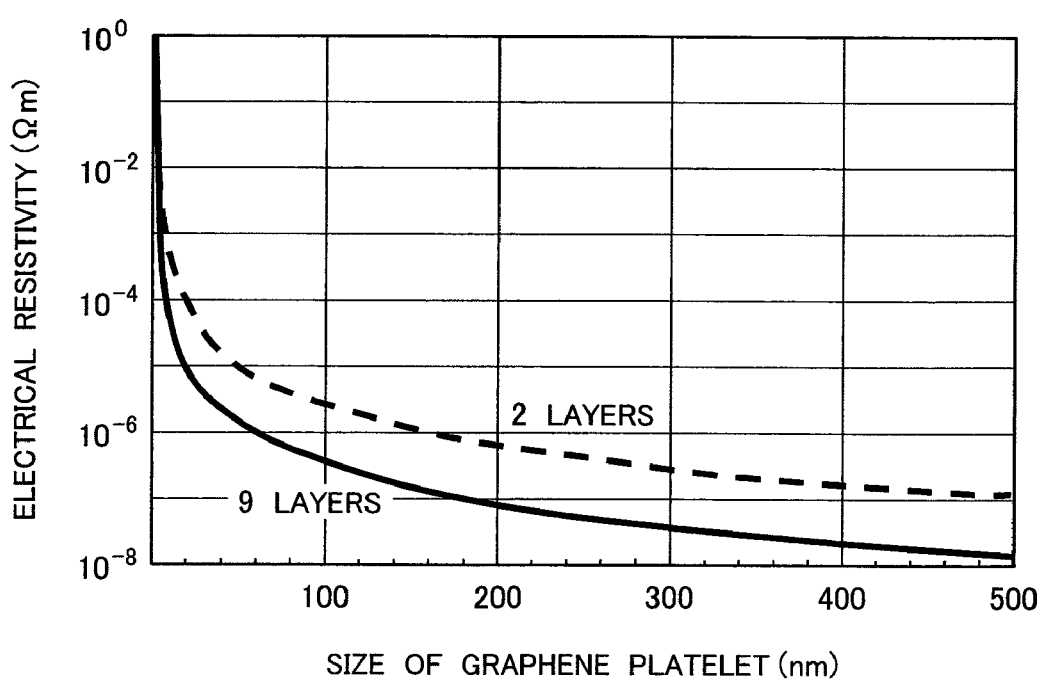
FIG. 2 is an explanatory graph showing the correlation between the size of graphene platelet and the electrical resistivity in accordance with the present invention.

As shown in FIG. 2, the electrical resistivity of a graphene transparent conductive film depends on the average size of graphene platelets, and the electrical resistivity decreases with increasing the average size. Furthermore, the light transmission depends on the number of layers of graphene platelets (the total number of atomic layers in the multilayer structure), and the light transmission increases with decreasing the number of layers. For a graphene transparent conductive film to achieve the conventional properties of ITO, an electrical resistivity of $1.0 \times 10^{-6}$ (Ωm) or less, and a light transmission at a wavelength of 550 nm of 80% or more, it needs to be formed of graphene platelets that are 50 nm or larger in average size and are in a 9- or less-layer stack.

Such a graphene transparent conductive film can be formed on the surface of a glass substrate by a chemical vapor deposition (CVD) method using acetylene gas as a starting material. In this method, a glass substrate is placed in a reaction tube of a growth furnace to be heated to 550° C. and acetylene gas is introduced to form a graphene transparent conductive film on the entire surface of the glass substrate. That is, each graphene platelet is grown parallel to the substrate surface. The number of graphene layers (total number of atomic layers) can be controlled by adjusting the flow of acetylene gas and the growth time. For example, a graphene transparent conductive film formed of 7-layer graphene (seven atomic layers) could be formed by setting the acetylene gas flow at 0.5 sccm (standard cc/min) and the growth time for 10 minutes. It was demonstrated that any hydrocarbon gas was able to be used, instead of acetylene, as a starting material for the chemical vapor deposition, and that a graphene transparent conductive film could be formed at growth temperatures of 400° C. or higher.

Other than by the above-mentioned chemical vapor deposition method, a similar graphene transparent conductive film was able to be formed by applying a solution of polyvinyl alcohol and volatile solvent onto a glass substrate by spinner coating, and by heat-treating the substrate at 500° C. under an atmosphere of nitrogen or other inert gas. On the condition that the heat treatment temperature was 400° C. or higher, the closer the heat temperature was to the upper temperature limit of the substrate, the lower the electrical resistivity of the formed graphene transparent conductive film was. It was demonstrated that polyvinyl chloride, polyvinyl pyrrolidone, polyacrylamide, polyethylene terephthalate, or hydroxypropyl cellulose could also be used instead of polyvinyl alcohol as a coating material. The coating material can also be applied by dipping, printing, or any method other than spinner coating. Furthermore, any substrate, such as a plastic substrate, with a heat resistance of 400° C. or higher can be used as the substrate.

Second Embodiment of Present Invention

Figure 4:
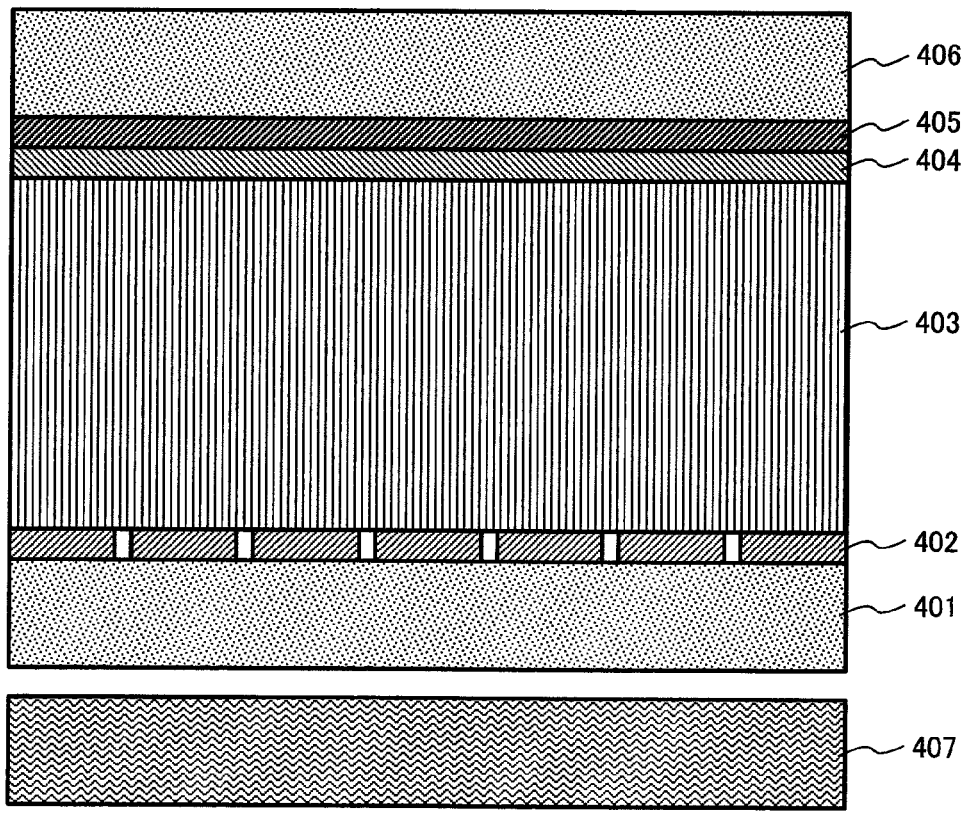
FIG. 4 is a schematic illustration showing a cross-sectional view of a liquid crystal display device including a transparent conductive film in accordance with a second embodiment of the present invention.

A second embodiment of the present invention will be described with reference to FIG. 4. FIG. 4 is a schematic illustration showing a cross-sectional view of a liquid crystal display device including a transparent conductive film in accordance with a second embodiment of the present invention. As shown in FIG. 4, in the liquid crystal display device, liquid crystal 403 is sandwiched between a lower glass substrate 401 provided with a lower transparent electrode 402, which is wired in the horizontal direction in the plane, and an upper glass substrate 406 provided with an upper transparent electrode 404, which is wired in the vertical direction in the plane, and a color filter 405. Light is irradiated from the backside of the lower glass substrate 401 by a backlight 407 to create an image on the side of the upper glass substrate 406.

The graphene transparent conductive films of the present invention were used for the lower transparent electrode 402 and the upper transparent electrode 404 of this liquid crystal display device. These graphene transparent conductive films had the electrical resistivity of $1.0 \times 10^{-6}$ ($\Omega$m) and the light transmission at a wavelength of 550 nm of 80%. In addition to liquid crystal display devices, the graphene transparent conductive films of the present invention can be used for other display devices including any flat panel display such as an organic light emitting display and an inorganic light emitting display.

Third Embodiment of Present Invention

Figure 5:
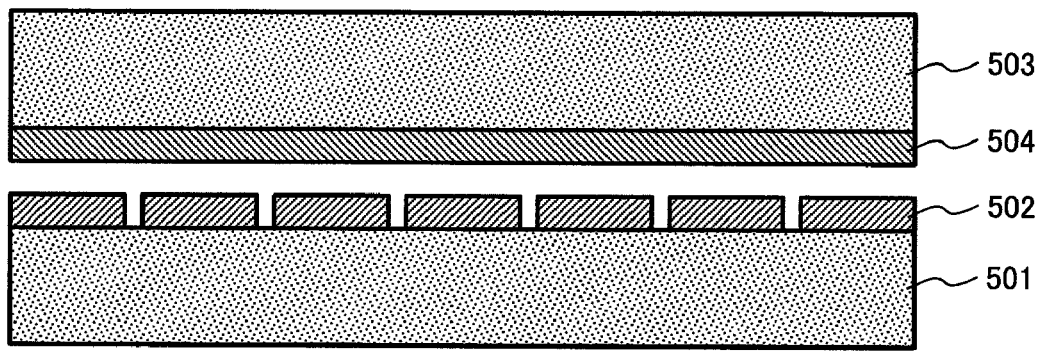
FIG. 5 is a schematic illustration showing a cross-sectional view of a touch panel device including a transparent conductive film in accordance with a third embodiment of the present invention.

A third embodiment of the present invention will be described with reference to FIG. 5. FIG. 5 is a schematic illustration showing a cross-sectional view of a touch panel device including a transparent conductive film in accordance with a third embodiment of the present invention. As shown in FIG. 5, in the touch panel, a lower substrate 501 provided with a lower transparent electrode 502, which is wired in the horizontal direction in the plane, and an upper substrate 503 provided with an upper transparent electrode 504, which is wired in the vertical direction in the plane, face each other at a certain interval with a spacer, etc. A touch on the upper substrate 503 causes the upper transparent electrode 504 and the lower transparent electrode 502 to come into contact at the touched position, thereby detecting the location of the touched position.

The graphene transparent conductive films of the present invention were used for the lower transparent electrode 502 and the upper transparent electrode 504 of this touch panel. These graphene transparent conductive films had the electrical resistivity of $1.0 \times 10^{-6}$ ($\Omega$m) and the light transmission at a wavelength of 550 nm of 80%.

Fourth Embodiment of Present Invention

Figure 6:
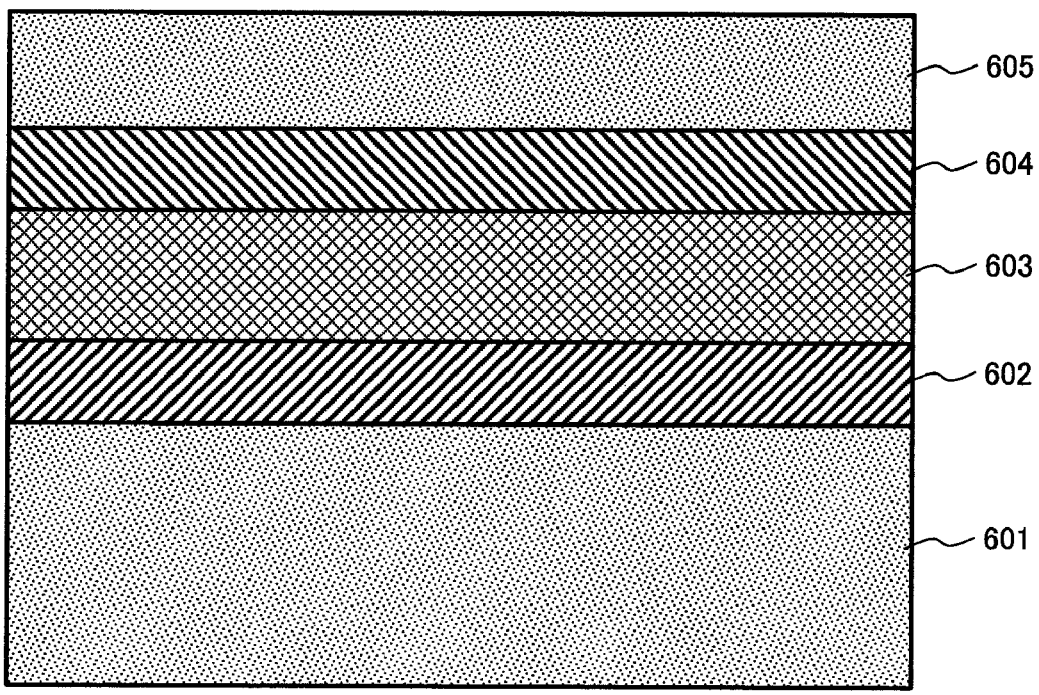
FIG. 6 is a schematic illustration showing a cross-sectional view of a photovoltaic cell device including a transparent conductive film in accordance with a fourth embodiment of the present invention.

A fourth embodiment of the present invention will be described with reference to FIG. 6. FIG. 6 is a schematic illustration showing a cross-sectional view of a photovoltaic cell device including a transparent conductive film in accordance with a fourth embodiment of the present invention. As shown in FIG. 6, in the photovoltaic cell, a light absorbing layer 603 to generate electricity by absorbing light is sandwiched between a lower substrate 601 provided with a lower electrode 602 and an upper substrate 605 provided with an upper transparent electrode 604.

The graphene transparent conductive film of the present invention was used for the upper transparent electrode 604 of this photovoltaic cell. The graphene transparent conductive films had the electrical resistivity of $1.0 \times 10^{-6}$ ($\Omega$m) and the light transmission at a wavelength of 550 nm of 80%.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A transparent conductive film, comprising graphene platelets overlapping one another to form a multilayer structure, wherein:
    an average size of the graphene platelets is 50 nm or more;
    each of the graphene platelets consists of single atomic layer or a plurality of atomic layers less than 9;
    a total number of the atomic layers in the multilayer structure is 9 or less; and
    the transparent conductive film has an electrical resistivity of $1.0 \times 10^{-6}$ $\Omega$m or less and a light transmission at a wavelength of 550 nm of 80% or more.

2. A transparent conductive film-on-substrate, comprising a substrate and the transparent conductive film according to claim 1 formed on the substrate, the substrate being made of a glass or a plastic.

3. An electronic device comprising the transparent conductive film according to claim 1.

4. The electronic device according to claim 3, wherein the electronic device is a flat panel display device, a touch panel, or a photovoltaic cell.

5. An electronic device comprising the transparent conductive film-on-substrate according to claim 2.

6. The electronic device according to claim 5, wherein the electronic device is a flat panel display device, a touch panel, or a photovoltaic cell.

7. A transparent conductive film-on-substrate comprising a substrate made of a glass or a plastic and a transparent conductive film formed on the substrate, the, wherein:
    the transparent conductive film is formed on the substrate by a chemical vapor deposition method using a hydrocarbon gas as a starting material at a growth temperature of 400° C. or higher;
    the transparent conductive film comprises graphene platelets overlapping one another to form a multilayer structure;
    an average size of the graphene platelets is 50 nm or more;
    each of the graphene platelets consists of single atomic layer or a plurality of atomic layers less than 9;
    a total number of the atomic layers in the multilayer structure is 9 or less; and
    the transparent conductive film has an electrical resistivity of $1.0 \times 10^{-6}$ $\Omega$m or less and a light transmission at a wavelength of 550 nm of 80% or more.

8. An electronic device comprising the transparent conductive film-on-substrate according to claim 7.

9. The electronic device according to claim 8, wherein the electronic device is a flat panel display device, a touch panel, or a photovoltaic cell.

10. The transparent conductive film-on-substrate comprising a substrate made of a glass or a plastic and a transparent conductive film formed on the substrate, the, wherein:

the transparent conductive film is formed by applying at least one material selected from polyvinyl alcohol, polyvinyl chloride, polyvinyl pyrrolidone, polyacrylamide, polyethylene terephthalate, and hydroxypropyl cellulose on the substrate and then by heat-treating the substrate at a temperature of 400° C. or higher under an atmosphere of inert gas;

the transparent conductive film comprises graphene platelets overlapping one another to form a multilayer structure;

an average size of the graphene platelets is 50 nm or more;

each of the graphene platelets consists of single atomic layer or a plurality of atomic layers less than 9;

a total number of the atomic layers in the multilayer structure is 9 or less; and the transparent conductive film has an electrical resistivity of $1.0 \times 10^{-6}$ Ωm or less and a light transmission at a wavelength of 550 nm of 80% or more.

11. An electronic device comprising the transparent conductive film-on-substrate according to claim 10.

12. The electronic device according to claim 11, wherein the electronic device is a flat panel display device, a touch panel, or a photovoltaic cell.

* * * * *